US 6,836,659 B2

United States Patent
Gouillou

(10) Patent No.: US 6,836,659 B2
(45) Date of Patent: Dec. 28, 2004

(54) CONTROL DEVICE FOR A COMMUNICATION SYSTEM OF AN AIRCRAFT, IN PARTICULAR OF A TRANSPORT PLANE

(75) Inventor: Jérôme Gouillou, Toulouse (FR)

(73) Assignee: Airbus France, Toulouse (FR)

( * ) Notice: Subject to any disclaimer, the term of this patent is extended or adjusted under 35 U.S.C. 154(b) by 368 days.

(21) Appl. No.: 10/067,272

(22) Filed: Feb. 7, 2002

(65) Prior Publication Data

US 2002/0119758 A1 Aug. 29, 2002

(30) Foreign Application Priority Data

Feb. 27, 2001 (FR) .............................................. 01 02634

(51) Int. Cl.[7] .............................. H04Q 7/20; H04B 7/00; H04B 1/38; H04M 1/00
(52) U.S. Cl. ..................... 455/431; 455/66.1; 455/90.1; 455/90.2; 455/90.3; 455/575.1; 455/508; 455/566
(58) Field of Search ........................ 455/66.1, 74, 90.1, 455/90.2, 90.3, 128, 344, 347, 431, 507, 508, 550.1, 553.1, 566, 575.1, 575.9, 899; 340/945, 971; 701/3; 244/1 R

(56) References Cited

U.S. PATENT DOCUMENTS

| | | | | |
|---|---|---|---|---|
| 4,009,451 A | * | 2/1977 | Moore et al. .................. 331/64 |
| 4,231,115 A | * | 10/1980 | Henderson et al. ............ 455/73 |
| 4,267,597 A | * | 5/1981 | Volpi et al. .................... 455/76 |
| 4,521,915 A | * | 6/1985 | Baker et al. ............... 455/165.1 |
| 4,531,233 A | * | 7/1985 | Nelson ..................... 455/173.1 |
| 4,651,282 A | * | 3/1987 | Robinson et al. ......... 455/158.2 |
| 5,903,227 A | * | 5/1999 | Scheuer ....................... 340/945 |
| 6,282,417 B1 | * | 8/2001 | Ward ........................... 455/431 |
| 6,650,897 B2 | * | 11/2003 | Nelson ........................ 455/431 |

* cited by examiner

Primary Examiner—Lee Nguyen
Assistant Examiner—Raymond B. Persino
(74) Attorney, Agent, or Firm—Stevens, Davis, Miller & Mosher, LLP

(57) ABSTRACT

A control device for a communication system of an aircraft, in particular of a transport plane. A control device includes a control section and a display section which depicts on a presentation screen at least two communication values (radio frequencies and/or telephone numbers) which have been selected and activated by way of the control section, among which, as the case may be, is the communication value which has been selected for the transmission. The control device also includes a mixing section for mixing all of the communication values which have been selected and activated by way of the control section.

14 Claims, 2 Drawing Sheets

CONTROL DEVICE FOR A COMMUNICATION SYSTEM OF AN AIRCRAFT, IN PARTICULAR OF A TRANSPORT PLANE

FIELD OF THE INVENTION

The present invention relates to a control device for a communication system of an aircraft, in particular of a transport plane.

BACKGROUND OF THE INVENTION

Within the framework of the present invention, the expression communication system is understood to mean a set of standard items of communication equipment, making it possible to implement and to supervise the audio communications on board the aircraft. These audio communications are, in particular, all those that the pilots of the aircraft may have, in particular with the air traffic control (by way of VHF [Very High Frequency] channels or HF [High Frequency] channels for example), with the airline companies (by way of a telephone link, for example on the "SATCOM" network), etc.

To control such a communication system (that is to say the set of said items of communication equipment), use is generally made of three different, mutually separate devices which are supplementary in respect of control, namely:
- a device for the selection or manual adjustment of the telephone numbers, via the SATCOM system for example, generally from a tree of MCDU pages ("Multipurpose Control and Display Unit");
- a device of the ACP type ("Audio Control Panel") for mixing several radiocommunication channels (VHF, HF, etc.) in reception. Within the framework of the present invention, the expression channel mixing (or radio frequency mixing) is understood to mean the mixing of several channels (or radio frequencies) with a particular adjustment of the sound volume of each of these channels (or radio frequencies) allowing simultaneous listening to the channels (or radio frequencies) thus adjusted. This ACP device also allows an operator to select the channel for the transmission (a single channel at a time); and
- a device for adjusting frequencies, of the RMP ("Radio Management Panel"), RCP ("Radio Control Panel") or RTP ("Radio Tuning Panel") type, for adjusting the radio frequencies of the various channels. This device for adjusting frequencies includes display means making it possible to depict on a presentation screen one, and only one, radiocommunication channel from among the various channels which are activated, which radiocommunication channel may be selected via push knobs or for which the radio frequency can be modified.

As said frequency adjusting device RMP, RCP or RTP:
- is independent of the ACP device intended for mixing and for adjusting the sound volume, as well as for selecting the channel for transmission; and
- displays only a radio frequency which is selected for a particular channel, the operators (pilot, co-pilot, etc.) of the aircraft, which use these various devices sometimes tend to regard the frequency which is displayed on the presentation screen of the RMP, RCP or RTP device as being that of the transmission channel, and adjusted by the ACP device, whereas this displayed frequency may in reality correspond to another channel.

This situation may give rise to a loss of time in so far as the crew not having adjusted the expected channel, remain in contact with the previous air traffic controller, whereas they believe themselves to be addressing the new controller and therefore the controller is made to repeat his change of frequency instruction.

Moreover, the standard use of three different, separate devices, as indicated previously, can monopolize the attention of pilots to the detriment of other crew tasks, in particular the fact of having to adjust and activate a frequency on one of the devices and to have to adjust the sound volume corresponding to this frequency on another of said devices, this possibly being an impediment in particular in fault or emergency situations.

This complexity is heightened when several of each of the three aforesaid devices are present on the flight deck. Thus, for example in aircraft of the "AIRBUS" type, a set made up of an ACP device and of an RMP device is available to each of the two pilots. Moreover, a third set of this type is arranged at the level of the ceiling of the flight deck. Furthermore, the mixing of the channels for reception is carried out independently by each pilot, whereas, for the adjustments (or inputs) of the frequencies and telephone numbers, the actions performed by a pilot on one of said three sets also modify the adjustments of the other two sets, since each of the various existing channels (VHF, HF, telephone, etc.) corresponds to equipment (transmitter, receiver, etc.) which can be adjusted only to a single frequency (or a channel/telephone number) at a given instant.

SUMMARY OF THE INVENTION

The present invention relates to a control device for a communication system making it possible to remedy these drawbacks.

To this end, according to the invention, said control device for a communication system of an aircraft supervising the audio communications of at least one operator of said aircraft, in particular a transport plane, said communication system effecting a communication in transmission and in reception by way of activatable values of communication (namely radio frequencies and/or telephone numbers) of particular communication channels (namely radiocommunication channels and/or telephone channels), said control device comprising a box which is furnished:
- with display means for depicting on at least one presentation screen at least one of said communication values; and
- control means capable of being actuated by an operator and comprising means of selection in transmission, means of selection in reception and means of input of a communication value, is noteworthy in that said display means are capable of depicting on said presentation screen at least two communication values which have been selected and activated by way of said control means, wherein said display means are formed in such a way as always to depict, automatically, on said presentation screen, as the case may be, the communication value which has been selected and activated for the transmission, and wherein said control means furthermore comprise, on said box, mixing means capable of being actuated by an operator and allowing the latter to mix all the communication values which have been selected and activated.

Thus, by virtue of the invention, the means of control (selection and activation) of the communication values (radio frequencies and/or telephone numbers) and the mixing means (that is to say for adjusting the sound volume) are situated on the same box, thereby avoiding the aforesaid toings and froings between various devices and allowing the operator (pilot, co-pilot, etc.) to carry out simple, fast, accurate and controlled supervision of his audio communications.

Moreover, and above all, by virtue of the invention, the operator always knows which communication value (in particular the radio frequency) is the one which is activated for the transmission so that the risk of him making inadvertent maladjustments of other communication values through lack of information, no longer exists.

The control device in accordance with the invention therefore aids the carrying out and the comprehension of the various commands and makes it possible to remedy the aforesaid drawbacks.

According to the invention:
- at least one of said communication channels is a radiocommunication channel of the aforesaid type and said communication values (of said communication channel) are radio frequencies; and/or
- at least one of said communication channels is a telephone channel, for example of the aforesaid SATCOM network, and said communication values (of said communication channel) are telephone numbers.

To aid the tagging of the communication value, and in particular of the radio frequency, which is activated in transmission:
- said display means highlight on the presentation screen the communication value activated in transmission; and/or
- said control means comprise a plurality of adjustment elements, each of which is intended for selecting and activating in transmission a particular communication channel, and comprises a light, and said control means control said lights in such a way as to activate, as the case may be, the light relating to the communication channel which is selected and activated in transmission.

Furthermore, advantageously, said display means depict on said presentation screen, respectively on different presentation zones, the communication values which have been selected and activated by way of the control means, for at least some of said communication channels.

Additionally, advantageously, in order to accurately inform the operators of the actual sound volume of each of the various communication values (in particular of the radio frequencies) which are activated:
- said display means depict on the presentation screen, for each communication value which is depicted on said presentation screen, a (sound volume) indicator which indicates the sound volume of the corresponding communication value and/or which indicates whether the corresponding communication value is selected in reception; and/or
- said mixing means comprise a plurality of adjustment elements, each of which is intended for selecting reception and for adjusting the sound volume of a particular communication channel, and each of said adjustment elements comprises a tag, making it possible to indicate the corresponding sound volume.

Additionally, in a particular embodiment, the control device in accordance with the invention furthermore comprises:
- storage means comprising at least one list of at least one communication value, which is capable of being depicted on said presentation screen by the display means;
- call means capable of being actuated by an operator and allowing the latter to call said list so that it is depicted on said presentation screen; and
- selection means capable of being actuated by an operator and allowing the latter to select a communication value from the list which is depicted on the presentation screen.

This particular embodiment makes it possible to achieve time savings [by anticipating the input of several useful frequencies (or telephone numbers) and by reducing the time required for frequency selection to the appropriate moments of change of frequency] and to avoid errors of input.

Moreover, advantageously, said control device also comprises a means, possibly removable, which is capable of being connected, by way of a digital link, to said storage means so as to automatically load at least one list of communication values into said storage means, thereby aiding and making safer the loading of communication values and, moreover, allowing the simultaneous loading of a plurality of such values.

Additionally, according to the invention, said control device furthermore comprises:
- means, for example a keyboard and/or a set of rotary elements, for adjusting the communication values; and/or
- means (buttons, thumbwheel, etc.) for displacing a particular sign over the presentation screen, making it possible to choose, from among the communication values which are depicted on said presentation screen, the one which one wishes to adjust.

The present invention also relates to a communication system, comprising in particular:
- a plurality of items of communication equipment (transmitters, receivers, etc.) making it possible to effect a communication in transmission and in reception by way of communication values on communication channels;
- means of audio communication [loudspeaker(s), microphone(s), etc.]; and
- a control device.

According to the invention, this communication system is noteworthy in that said control device is such as that stated above.

BRIEF DESCRIPTION OF THE DRAWING

The figures of the appended drawing will elucidate the manner in which the invention may be embodied. In these figures, identical references designate similar elements.

DETAILED DESCRIPTION OF THE PREFERRED EMBODIMENTS

Figure 1:
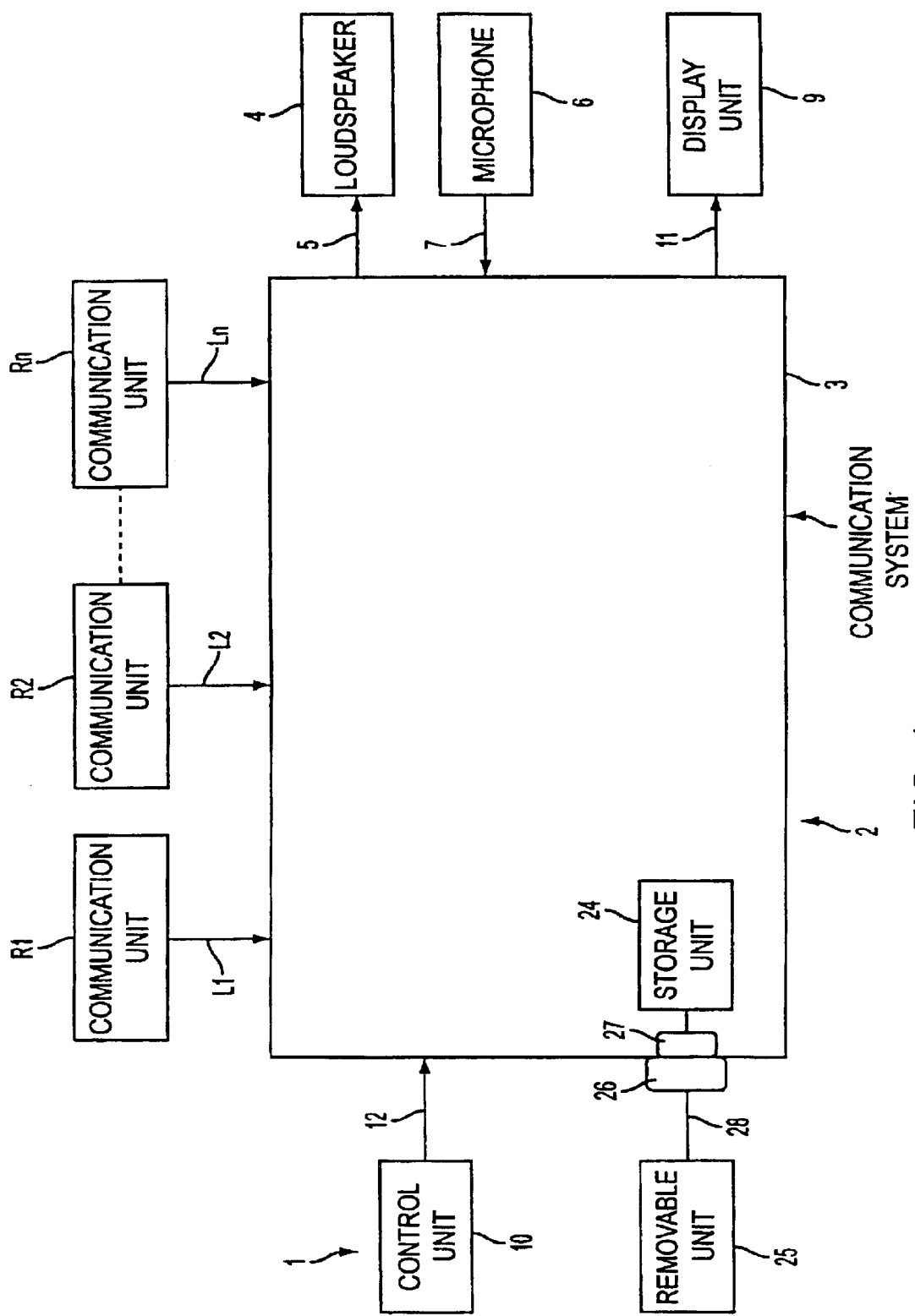
FIG. 1 is the schematic diagram of a communication system which is furnished with a control device in accordance with the invention.

The control device 1 in accordance with the invention is intended for controlling a communication system 2 represented diagrammatically in FIG. 1, which is carried on board an aircraft, in particular a civil transport plane, not represented.

Such a communication system 2 makes it possible to implement and to supervise, in the usual manner, the audio communications on board the aircraft. These audio communications are all those which the pilots of the aircraft may have, in particular with the air traffic control (by way of VHF ["Very High Frequency"] channels or HF ["High Frequency"] channels for example), with the airline companies (by way of a telephone link, for example over the "SATCOM" network), etc. These communications may also relate to those of others conversing on the aircraft, such as the crew members or the passengers.

Figure 2:
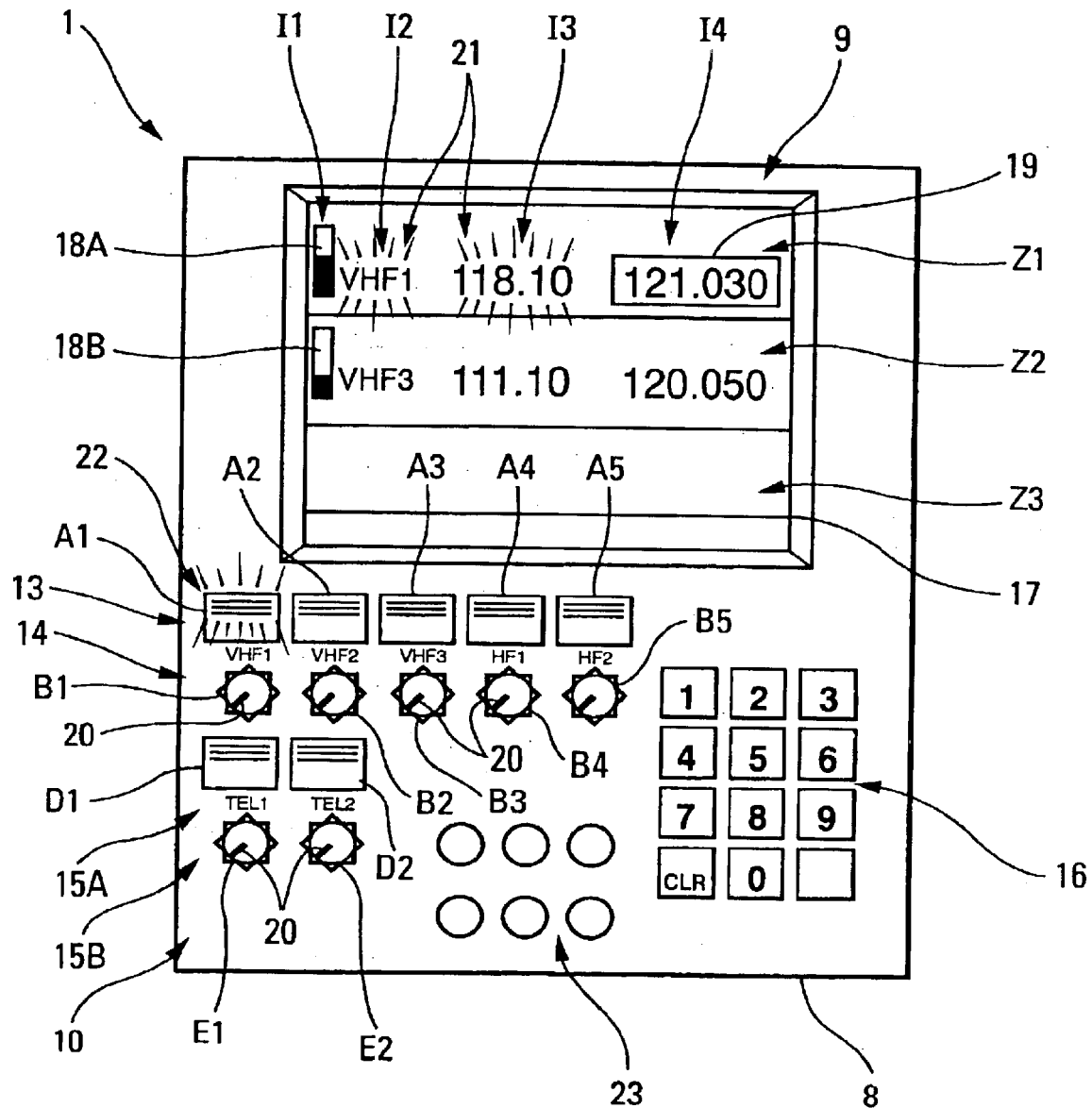
FIG. 2 diagrammatically shows an exemplary embodiment of a control device in accordance with the invention.

This communication system 2 comprises in a known and general manner:

a central unit 3;

means of communication R1, R2, ..., Rn, of standard type, connected respectively by links L1, L2, ..., Ln to the central unit 3 and making it possible to effect a communication in transmission and in reception by way of communication values. Within the framework of the present invention, the expression communication value is understood to mean either a radio frequency specified hereinbelow, or a telephone number likewise specified hereinbelow. These communication means R1 to Rn comprise in particular transmitters and receivers, working respectively in transmission and in reception on communication values belonging to particular communication channels of the aforesaid type;

at least one loudspeaker 4 which is connected by a link 5 to the central unit 3;

at least one microphone 6 which is connected by a link 7 to the central unit 3; and said control device 1 represented in FIG. 2 and comprising in particular, on a single box 8, display means 9 and control means 10 which are connected, respectively by links 11 and 12, to the central unit 3.

According to the invention, said control means 10 are arranged on a single control panel and are formed so as, simultaneously:

to select and activate a single communication value in transmission for each type of communication value (radio frequency and telephone number), that is to say so as to choose such a communication value (radio frequency, telephone number) and to control the appropriate communication means R1 to Rn so that they carry out a communication in transmission;

to select and activate several communication values (radio frequencies and/or telephone numbers) simultaneously in reception; and to mix all the communication values which are activated. To do this, said control means 10 comprise:

selection means 13, 15A specified hereinbelow, capable of being actuated by an operator (pilot, co-pilot, etc.) and allowing the latter to select and to activate for the transmission a single communication value (radio frequency, telephone number); and mixing means 14, 15B specified hereinbelow, capable of being actuated by an operator and allowing the latter to activate reception and to mix all the communication values which have been selected and activated, while adjusting the individual volumes.

Moreover, according to the invention, said display means 9 are capable of depicting on at least one presentation screen 17 at least two communication values which have been selected and activated by way of said control means 10. These display means 9 are moreover formed in such a way as always to depict, automatically, on said presentation screen 17, as the case may be, the communication value [radio frequency (118.10) in FIG. 2] which has been selected and activated for transmission, by way of said control means 10.

Thus, by virtue of the invention, the selection means and the mixing means (that is to say means of activation and adjustment of the sound volume) are situated on the same box (or the same control panel), thereby avoiding the numerous toings and froings which exist with the standard devices and allowing the operator (pilot, co-pilot) to carry out simple, fast and accurate supervision of his audio communications.

Moreover, and above all, by virtue of the invention, the operator always knows which communication value is the one activated for transmission. Thus, for example when adjusting a radio frequency for transmission, the risk of the pilot carrying out inadvertent maladjustments of other frequencies through lack of information, no longer exists.

According to the invention, said selection means comprise, as represented in FIG. 2:

said means 13 which comprise means A1 to A5, in particular push buttons, for selecting a radiocommunication channel from among a plurality of available channels (VHF1, VHF2, VHF3, HF1 and HF2 in the example of FIG. 2);

said means 15A which include means D1, D2, in particular push buttons, for selecting a telephone channel (TEL1, TEL2); and a set 16 of buttons or a set 23 (depicted diagrammatically) of rotary knobs, for inputting the value of a new radio frequency or of a new telephone number. The value which will be input is displayed on the right, while that which has been input previously and which is activated is displayed on the left on the presentation screen 17.

The mixing means 14 include, for their part, in particular means B1 to B5, especially rotary knobs, which are associated respectively with said means A1 and A5 and which allow an operator to adjust the sound volumes respectively of the frequencies which are activated on the channels chosen by the means 13.

Furthermore, the mixing means 15B include rotary knobs E1, E2, which are associated respectively with the two aforesaid telephone channels (TEL1 and TEL2) of the SATCOM network and which make it possible to adjust the corresponding sound volumes.

In addition, the presentation screen 17 includes various presentation zones Z1, Z2 and Z3. The zones Z1 and Z2 are intended for indicating at least some of the radio frequencies which are activated (one of which being the radio frequency which is activated for transmission) and the zone Z3 is intended for indicating the telephone number which may possibly be called, no number being called in the example of FIG. 2.

Each of the zones Z1 and Z2 is associated with one and the same radiocommunication channel and includes different information regions I1, I2, I3 and I4, respectively comprising, for this channel:

an indicator 18A, 18B of sound volume and of activation in reception;

the name of the channel (VHF1, VHF3);

the frequency which is activated (118.10 and 111.10) expressed in MHz; and the frequency being input (121.030 and 120.50) also in MHz.

Moreover, according to the invention, when a frequency is currently being input, it is highlighted by a particular sign 19, for example a rectangle, as represented for the frequency of 121.030 MHz in zone Z1 of FIG. 2. The control means 10 include means (buttons, thumbwheel, etc.), for example of the set 23, which make it possible to displace the particular sign 19 so as to choose the communication value which one desires to adjust.

The sound volume indicators 18A and 18B are known vertical barographs. The sound volume is manifested by the level of fill of the barograph and the selection of the means in reception is manifested by the presence of an empty barograph. The sound volume may also be deduced from the position of a tag 20 which is provided on each of the rotary knobs B1 to B5, E1 and E2, with respect to a reference position (not represented).

In addition, to aid the tagging, as the case may be, of the communication value which is activated in transmission, which value according to the invention is always displayed, the latter is highlighted on the box 8:

on the one hand, by way of the display means 9, in particular by a change of appearance, for example by a change of color or increased brightness at the level of the information regions I2 and I3 (name of the channel selected and numerical value of the frequency), as is illustrated by a signal 21 in FIG. 2; and on the other hand, by the triggering of a light at the level of the button for selecting the transmission channel, as is illustrated for the push knob A1 by a signal 22 in FIG. 2.

Each of the push knobs A1 to A5, D1 and D2 includes such a light (not represented), which is preferably integrated into the associated push knob.

The control means 10 include, moreover, the set 23 of control elements (in particular the aforesaid rotary knobs), which are standard (buttons, knobs, etc.) and not described further.

In a preferred embodiment, the control device 1 in accordance with the invention also includes:

storage means 24 of standard type (a standard memory), comprising at least one list of communication values (radio frequencies and/or telephone numbers), which is capable of being depicted on said presentation screen 17 by the display means 9. This list may possibly be composed of a single radio frequency or of a single telephone number;

call means, for example a control element for the set 23, capable of being actuated by an operator and allowing the latter to call said list so that it is depicted on said presentation screen 17; and selection means, for example a control element for the set 23, capable of being actuated by an operator and allowing the latter to select at least one of the communication values from the list which is depicted on the presentation screen 17 (following a call).

This preferred embodiment makes it possible to achieve time savings (by anticipating the input of several useful values, in particular of frequencies, and by reducing the time required for value selection to the appropriate moments of change of value) and to avoid errors of input.

Moreover, to aid the loading of a list into the storage means 24, the control device 1 moreover includes a means which may be removable 25 of standard type, which is capable of being connected (by way of a means of connection 26 cooperating with a means of connection 27 of said storage means 24) to said storage means 24, as represented in FIG. 1, so as to load automatically, by way of a digital link 28, at least one list of frequencies into said storage means 24.

What is claimed is:

1. A control device for a communication system of an aircraft supervising the audio communications of at least one operator of said aircraft, in particular a transport plane, said communication system effecting a communication in transmission and in reception by way of activatable values of communication of communication channels, said control device comprising a box which comprises:

display means for depicting on at least one presentation screen at least one of said communication values; and control means capable of being actuated by an operator and comprising means of selection in transmission, means of selection in reception and means of input of a communication value, wherein said display means are capable of depicting on said presentation screen at least two communication values which have been selected and activated by way of said control means, wherein said display means are formed in such a way as always to depict, automatically, on said presentation screen, as the case may be, the communication value which has been selected and activated for the transmission, and wherein said control means furthermore comprise, on said box mixing means capable of being actuated by an operator and allowing the latter to mix all the communication values which have been selected and activated.

2. The device as claimed in claim 1, wherein at least one of said communication channels is a radiocommunication channel and said communication values of said communication channel are radio frequencies.

3. The device as claimed in claim 1, wherein at least one of said communication channels is a telephone channel and said communication values of said communication channel are telephone numbers.

4. The control device as claimed in claim 1, wherein said display means depict on said presentation screen, respectively on different presentation zones, the communication values which have been selected and activated by way of the control means for at least some of said communication channels.

5. The control device as claimed in claim 1, wherein said display means highlight on the presentation screen, as the case may be, the communication value activated for the transmission, which is depicted on said presentation screen.

6. The control device as claimed in claim 1, wherein said control means comprise a plurality of adjustment elements, each of which is intended for selecting and activating in transmission a particular communication channel, and comprises a light, and wherein said control means control said lights in such a way as to activate, as the case may be, the light relating to the communication channel which is selected and activated in transmission.

7. The control device as claimed in claim 1, wherein said display means depict on the presentation screen, for each communication value which is depicted on said presentation screen, a sound volume indicator which indicates the sound volume of the corresponding communication value.

8. The control device as claimed in claim 1, wherein said display means depict on the presentation screen, for each communication value which is depicted on said presentation screen, an indicator which indicates whether the corresponding communication value is selected in reception.

9. The control device as claimed in claim 1, wherein said mixing means comprise a plurality of adjustment elements, each of which is intended for selecting reception and for adjusting the sound volume of a particular communication channel, and wherein each of said adjustment elements comprises a tag, making it possible to indicate the corresponding sound volume.

10. The control device as claimed in claim 1, which device furthermore comprises:
- storage means comprising at least one list of at least one communication value, which is capable of being depicted on said presentation screen by the display means;
- call means capable of being actuated by an operator and allowing the latter to call said list so that it is depicted on said presentation screen; and
- selection means capable of being actuated by an operator and allowing the latter to select a communication value from the list which is depicted on the presentation screen.

11. The control device as claimed in claim 10, which device furthermore comprises a means capable of being connected, by way of a digital link, to said storage means so as to automatically load at least one list of communication values into said storage means.

12. The device as claimed in claim 1, which device furthermore comprises means for adjusting the communication values.

13. The device as claimed in claim 1, which device furthermore comprises means for displacing a particular sign over the presentation screen, making it possible to choose, from among the communication values which are depicted on said presentation screen, the one which one wishes to adjust.

14. A communication system, comprising in particular:
- a plurality of items of communication equipment making it possible to effect a communication in transmission and in reception by way of communication values on communication channels;
- means of audio communication; and
- a control device, wherein said control device is such as that specified under claim 1.

* * * * *